United States Patent [19]
Hashimoto et al.

[11] Patent Number: 5,262,735
[45] Date of Patent: Nov. 16, 1993

[54] RING OSCILLATOR HAVING OUTPUTS THAT ARE SELECTIVELY COMBINED TO PRODUCE DIFFERENT FREQUENCIES

[75] Inventors: Yasuhiro Hashimoto; Katsuya Ishikawa; Chikara Tsuchiya, all of Kawasaki, Japan

[73] Assignee: Fujitsu Limited, Kanagawa, Japan

[21] Appl. No.: 915,251

[22] Filed: Jul. 20, 1992

[30] Foreign Application Priority Data

Jul. 19, 1991 [JP] Japan .................. 3-179250

[51] Int. Cl.$^5$ .................. H03B 5/02; H03B 27/00
[52] U.S. Cl. .................. 331/45; 331/57; 331/60; 331/74; 331/108 B
[58] Field of Search .................. 331/45, 57, 60, 74, 331/75, 108 B, 135, 136

[56] References Cited

U.S. PATENT DOCUMENTS

| | | | |
|---|---|---|---|
| 4,833,695 | 5/1989 | Greub | 331/57 X |
| 5,012,142 | 4/1991 | Sonntag | 331/57 X |
| 5,180,994 | 1/1993 | Martin et al. | 331/57 X |

*Primary Examiner*—Siegfried H. Grimm
*Attorney, Agent, or Firm*—Staas & Halsey

[57] ABSTRACT

A ring oscillator comprises a plurality of amplifiers connected in a multi-stage connection and each including a pair of output terminals from which first output signals are issued respectively; a pair of input terminals to which another pair of output terminals of a last stage amplifier are connected, respectively, and an amplifying circuit arranged between the output terminals and the input terminals. An oscillating signal can be generated by taking out the respectively corresponding second output signals from the amplifiers and combining these second output signals. The ring oscillator is constructed such that the second output signals are taken out from any middle output terminals in the amplifying circuit, other than the output terminals and the input terminals. Preferably, the amplifying circuit includes differential amplifying units each having a pair of differential transistors and a pair of emitter follower units having emitter follower transistors, respectively, and the second output signals are taken out from any portions among the output portions of the emitter follower units and all stage amplifying units other than the final stage differential amplifying unit.

12 Claims, 10 Drawing Sheets

Fig. 4
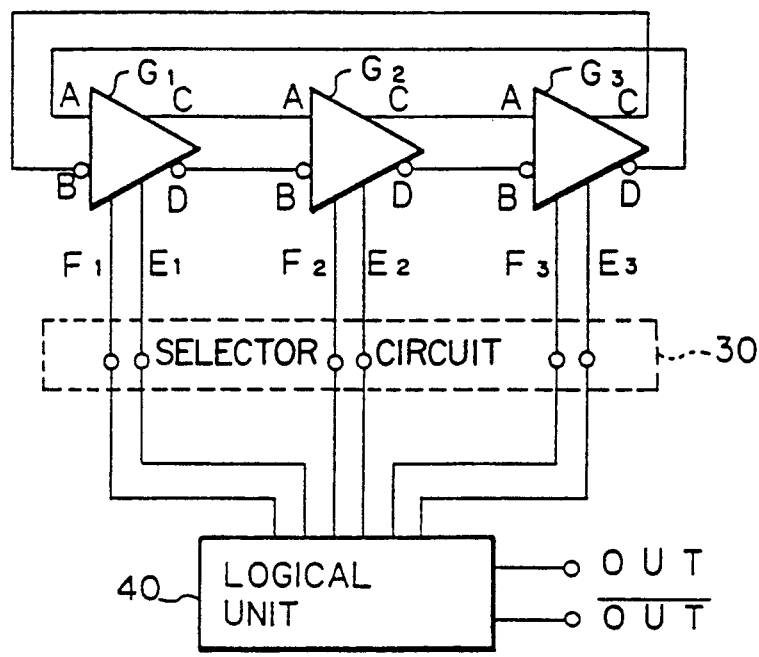
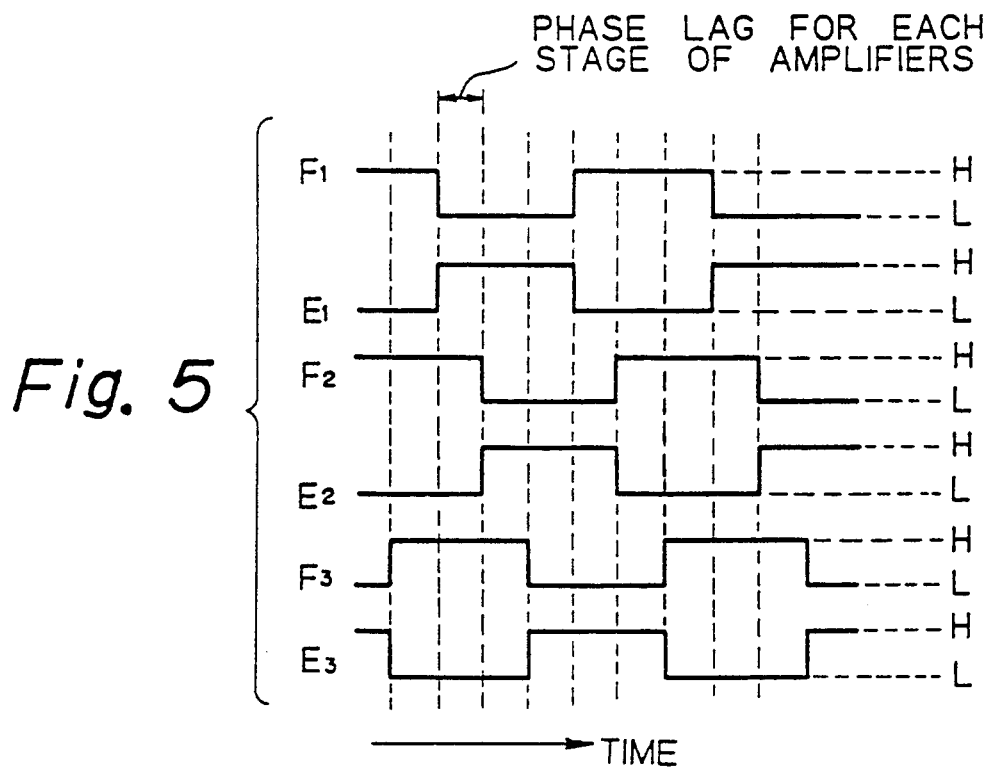
Fig. 5

RING OSCILLATOR HAVING OUTPUTS THAT ARE SELECTIVELY COMBINED TO PRODUCE DIFFERENT FREQUENCIES

BACKGROUND OF THE INVENTION

1. Field of the Invention

The present invention relates to a ring oscillator in which an oscillating signal having any frequency can be provided. Generally, in the ring oscillator that is constituted by connecting a plurality of amplifiers in multi-stages and by executing a ring feedback from the final stage amplifier to the first stage amplifier, the signal with a desired frequency can be generated by adequately combining outputs from the respective stage amplifiers with each other.

Typically, such a ring oscillator can be used for controlling the servomechanism of a video camera, the sequential operations of a computer system, various peripheral units and the like.

2. Description of the Related Art

In a known ring oscillator, usually, plural amplifiers, e.g., more than three operational amplifiers each having a relatively high input impedance are connected in a multi-stage connection (cascade connection). Further, the output terminals of a final stage amplifier are connected to the input terminals of a first stage amplifier to form a ring feedback.

In such a construction, the corresponding first output signals are issued from the respective pairs of output terminals of multi-stage amplifiers and supplied to the corresponding pairs of input terminals of the respective next stage amplifiers. Further, the corresponding branch output signals that branch from the above respective pairs of output terminals are supplied to a control switching circuit, e.g., a selector circuit, as the second output signals. Further, in the above control switching circuit, predetermined output signals are selected by switching operations from the above second output signals and then supplied to a logical circuit composed of various logical elements. If the above selected second output signals are combined adequately by the above logical circuit, the oscillating signal having a desired frequency (period) can be obtained.

In this case, as described above, the first output signals and the second output signals are sent simultaneously from each pair of output terminals of multi-stage amplifiers to the corresponding pair of input terminals of each next stage amplifier and the common control switching circuit, respectively. In other words, the above first and second output signals are taken out in parallel formation for each pair of output terminals.

Typically, a differential amplifying unit having a pair of differential transistors is arranged in the output terminals of each stage amplifier. Further, between the corresponding collectors of the above pair of differential transistors and a common power source line such as a collector voltage supply line, a pair of load elements of resistors are connected respectively. Further, a pair of connecting points between the pair of resistors and the corresponding collectors of the pair of differential transistors are connected to the corresponding output terminals respectively. Then, the first and second output signals are taken out in parallel formation from the above pair of resistors.

In the case that combinations of various kinds of second output signals are appropriately executed so that the final oscillating signal is set to a desired frequency, i.e., a desired period, if one of the second output signals corresponding to only one terminal of a pair of output terminals in a given stage amplifier is selected, then the difference between the currents that flow into the selector circuit respectively has occurred in the above pair of output terminals. Accordingly, the difference between the currents that flow through the pair of load elements of resistors respectively has also occurred and then the respectively corresponding voltage drops by the above resistors become different from each other. Therefore, the voltages of output signals between the corresponding first output signals also become unbalanced and the conditions for generating certain pulse signals from the first output signals are likely to have some discrepancies between the pair of output terminals of each stage amplifier. In other words, when combinations of a number of second output signals are modified by adequately operating the selector circuit to obtain any oscillating frequency owing to the frequency dividing operation of the logical circuit, the first output signals that flow through each stage amplifier in turn may be sometimes influenced by the voltage imbalance of the above second output signals and discrepancies between various conditions for the respective first output signals may have occurred.

Therefore, the phase lag between one side and another side of each pair of output terminals for each stage of multi-stage amplifiers becomes somewhat different, and further the time lag in the timing of the trailing edge of each pulse signal of output signals, which is originally designed to be a specified value for each stage amplifier, is shifted slightly between the above two sides of the pair of output terminals. Consequently, a problem arises in that jitters (fluctuations), etc., occur in the above trailing edge because of the time lag shifting, which leads to a deterioration of the accuracy in setting the oscillating frequency.

Particularly, in recent years, frequency control with a higher degree of accuracy has been required for video cameras, computer systems, etc. Therefore, the above problem becomes more significant.

SUMMARY OF THE INVENTION

Accordingly, an object of the present invention is to provide a ring oscillator that can generate an oscillating signal having a desired frequency with a higher degree of accuracy and with higher stability by preventing the time lag shifting of the trailing edge of each of the first output signals owing to the imbalance between the voltages of the second output signals when selecting adequate signals from the above second output signals.

To attain the above objects, the ring oscillator according to the present invention comprises a plurality of amplifiers connected with each other so that a multi-stage connection and a ring feedback can be executed including the following components: a pair of output terminals from which first output signals are issued respectively; a pair of input terminals to which another pair of output terminals of a last stage amplifier are connected respectively; and an amplifying circuit arranged between the output terminals and the input terminals. Further, an oscillating signal with a desired frequency can be generated by taking out the respectively corresponding second output signals from the amplifiers and adequately combining the second output signals with each other. In this case, the ring oscillator is constructed such that the second output signals are taken out from any of the middle output terminals in the amplifying circuit, other than the output terminals and the input terminals.

Preferably, the above amplifying circuit includes the following components: differential amplifying units constituted in at least one stage and each having a pair of differential transistors, in which the output portions of a final stage differential amplifying unit are connected to the output terminals, respectively, and a pair of emitter follower units having emitter follower transistors respectively, whose respective input portions are connected to the input terminals and whose respective output portions are connected to the input portions of a first stage differential amplifying unit to drive the differential transistors, respectively. Further, the ring oscillator is constructed such that the second output signals are taken out from any predetermined output portions among the output portions of the emitter follower units and all stage differential amplifying units other than the final stage differential amplifying unit.

In a preferred embodiment, the above amplifying circuit includes the following components: a differential amplifying unit constituted in one stage and having a pair of differential transistors (i.e., bipolar transistors); a pair of emitter follower units having emitter follower transistors, respectively; a pair of first load elements that generate the respectively corresponding voltages proportional to the currents flowing through the respective differential transistors, and a pair of second load elements that generate the respectively corresponding voltages proportional to the currents flowing through the respective emitter follower transistors. Further, the respectively corresponding voltages generated by the first load elements or the voltages that are related to the respectively corresponding voltages generated by the first load elements are taken out as the first output signals, respectively. Also, the respectively corresponding voltages generated by the second load elements or the voltages that are related to the respectively corresponding voltages generated by the second load elements are taken out as the second output signals, respectively.

More concretely, the above first load elements are resistors connected between the respectively corresponding collectors of the differential transistors and a common power source line. Also, the above second load elements are resistors connected between the respectively corresponding collectors of the emitter follower transistors and the common power source line.

In another preferred embodiment, the above amplifying circuit includes the following components: two differential amplifying units connected in two stages and arranged between the output terminals and the input terminals and each having a pair of differential transistors; a pair of first load elements that generate the respectively corresponding voltages proportional to the currents flowing through the respective differential transistors of the second stage amplifying unit, and a pair of second load elements that generate the respectively corresponding voltages proportional to the currents flowing through the respective differential transistors of the first stage amplifying unit. Further, the respectively corresponding voltages generated by the first load elements are taken out as the first output signals, respectively. Also, the respectively corresponding voltages generated by the second load elements are taken out as the second output signals, respectively.

More concretely, the above first load elements are resistors connected between the respectively corresponding collectors of the differential transistors of the second stage amplifying unit and a common power source line. Also, the above second load elements are resistors connected between the respectively corresponding collectors of the differential transistors of the first stage amplifying unit and the common power source line.

Further preferably, in another preferred embodiment, buffer units are provided for the respective stage amplifiers, so that the respectively corresponding second output signals can be issued via said buffer units.

Further preferably, the ring oscillator according to the present invention comprises more than three stage amplifiers. Additionally, it comprises a selector circuit that selects adequate signals among the respectively corresponding second output signals from the three stage amplifiers, and a logical unit that performs logical operations for the selected signals by the selector circuit.

In still another preferred embodiment, a pair of differential metal-oxide-semiconductor transistors and a pair of source follower metal-oxide-semiconductor transistors are utilized for the amplifying circuit, instead of bipolar transistors as previously described.

More concretely, the first load elements are resistors connected between the respectively corresponding drains of the differential metal-oxide-semiconductor transistors and another common power source line. Also, the second load elements are resistors connected between the respectively corresponding drains of the source follower metal-oxide-semiconductor transistors and the above power source line.

In still another preferred embodiment, a differential amplifying means having a pair of differential metal-oxide-semiconductor transistors and a pair of emitter follower units having emitter follower transistors, respectively, are provided as the main components of the amplifying circuit to utilize the advantages of the above bipolar transistors and metal-oxide-semiconductor transistors.

More concretely, the first load elements are resistors connected between the respectively corresponding drains of the differential metal-oxide-semiconductor transistors and another common power source line. Also, the second load elements are resistors connected between the respectively corresponding collectors of the emitter follower transistors and a common power source line.

In summary, according to the present invention, the first output signals and the second output signals are taken out from the different load elements, respectively, such as the pair of first load elements and the pair of second load elements. Therefore, even though the currents in the second output signals fluctuate because of the switching operations of the selector circuit, such fluctuations have no influence on the voltage drops in the pair of the first load elements. Consequently, voltage changes in the first output signals can be avoided.

BRIEF DESCRIPTION OF THE DRAWINGS

The above object and features of the present invention will be more apparent from the following description of the preferred embodiments with reference to the accompanying drawings, wherein:

FIG. 4 is a schematic block diagram showing a ring oscillator utilizing the amplifier of FIG. 3;

FIG. 5 is an example of a time chart showing second output signals in a ring oscillator of FIG. 4;

DESCRIPTION OF THE PREFERRED EMBODIMENTS

Before describing the embodiments of the present invention, the related art and the disadvantages therein will be described with reference to the related figures.

Figure 1:
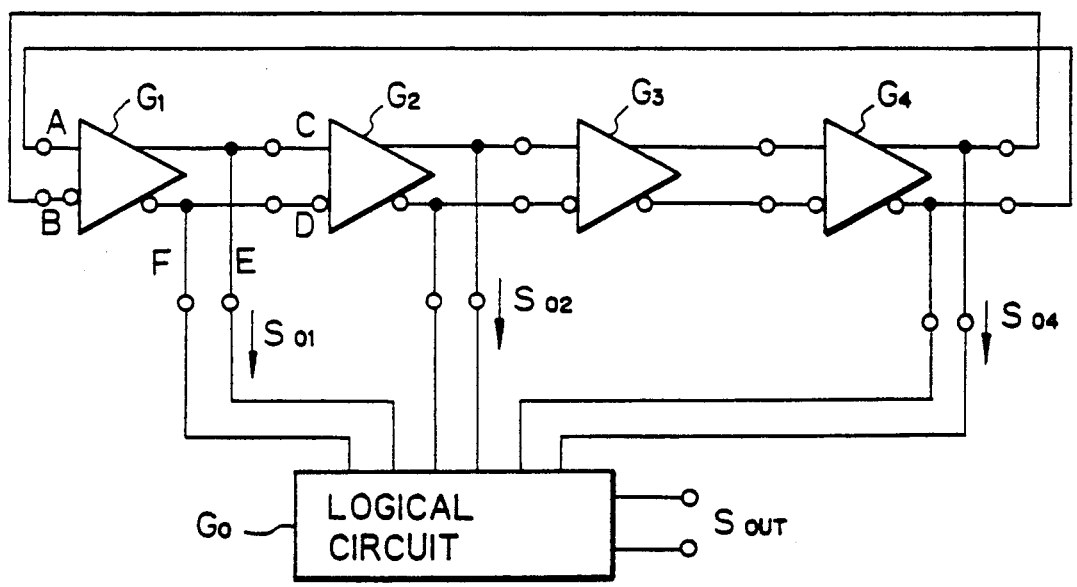
FIG. 1 is a schematic block diagram showing a ring oscillator according to a prior art.
Figure 2:
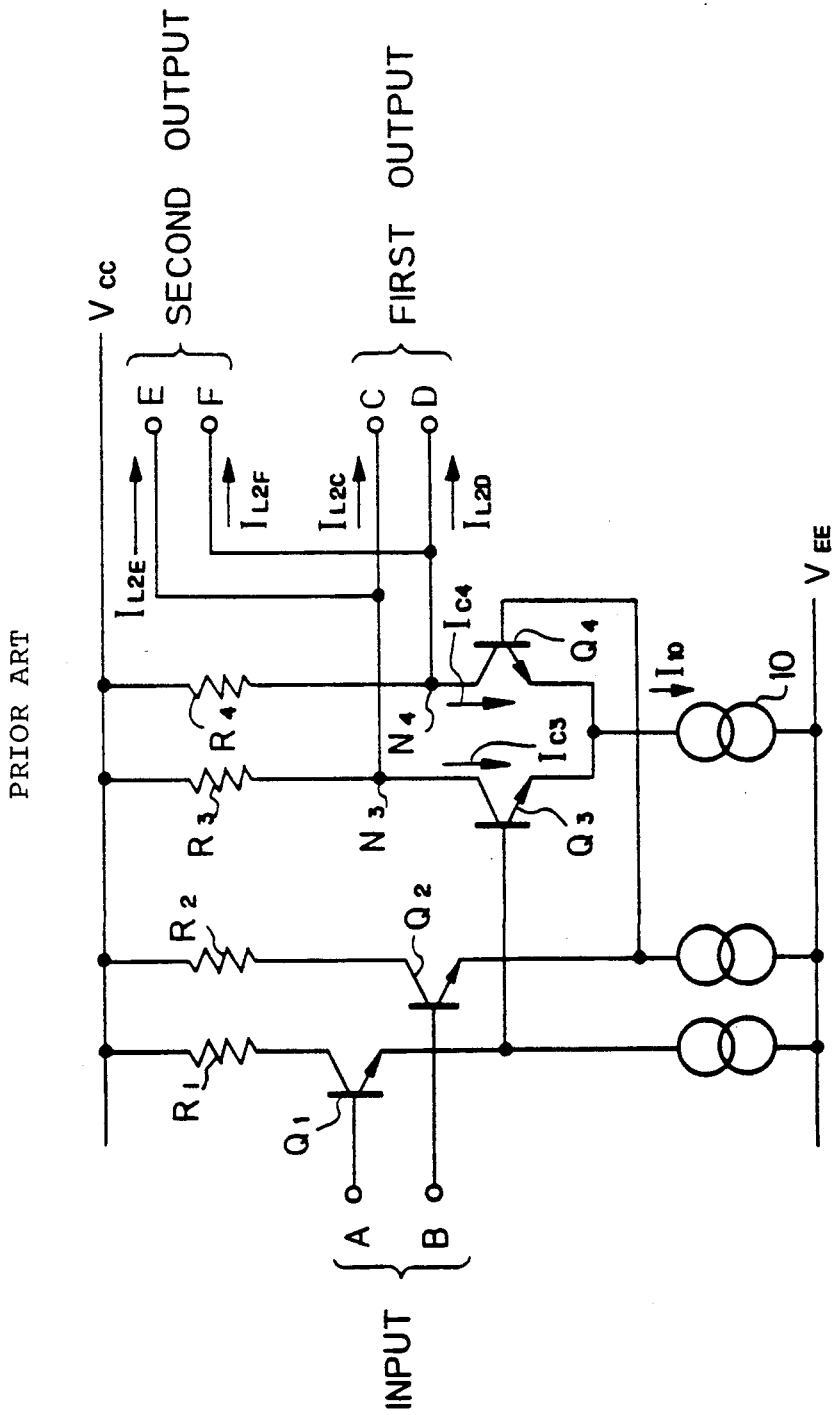
FIG. 2 is a circuit diagram showing the construction of each amplifier of FIG. 1.

FIGS. 1 and 2 are views showing a ring oscillator according to a prior art. To be more specific, FIG. 1 is a schematic block diagram showing the whole construction of the ring oscillator and FIG. 2 is a circuit diagram showing the construction of each amplifier of FIG. 1.

In these figures, four amplifiers $G_1$, $G_2$, $G_3$ and $G_4$ are connected in a multi-stage connection. Further, the output terminals of a final (fourth) stage amplifier $G_4$ are connected to the input terminals of a first stage amplifier $G_1$ to form a ring feedback. Generally, a lot of amplifiers are connected in cascade formation to constitute a ring oscillator. However, in this case, only four amplifiers connected in four stages will be illustrated representatively in order to simplify the drawings and explanation thereof.

Here, plural pairs of branch output signals (in an example shown in FIGS. 1 and 2, three pairs of branch output signals $S_{01}$, $S_{02}$ and $S_{04}$) that branch from the respectively corresponding pairs of output terminals of three amplifiers $G_1$, $G_2$ and $G_4$ are supplied to a selector circuit (not illustrated in FIGS. 1 and 2). Further, in the above selector circuit, predetermined output signals are selected by switching operations from the above three pairs of branch output signals $S_{01}$, $S_{02}$, and $S_{04}$ and then supplied to a logical circuit $G_0$ composed of various logical elements. If the above selected second output signals are adequately combined by the above logical circuit $G_0$, an oscillating signal having a desired frequency (period) can be finally obtained.

To be more specific about the construction of each of the above four amplifiers $G_1$, $G_2$, $G_3$ and $G_4$, as shown in FIG. 2, $Q_1$ and $Q_2$ denote a pair of transistors constituting an emitter follower circuit, in which complementary input signals A, B (also, other first output signals from a pair of output terminals of the last stage amplifier), that are supplied to a pair of input terminals, are taken out from the respectively corresponding emitters. Further, $Q_3$ and $Q_4$ denote a pair of differential transistors that are driven by the above pair of transistors $Q_1$, $Q_2$, respectively. Further, between the respectively corresponding collectors of the above pair of differential transistors $Q_3$, $Q_4$ and a common power source line, e.g., the power supply line for a collector voltage $V_{CC}$, a pair of resistors $R_3$, $R_4$, are connected, respectively. Each of the collector currents $I_{C3}$, $I_{C4}$ that flow through the pair of differential transistors $Q_3$, $Q_4$, respectively, is regulated by a constant current source 10 so that the value of the sum of the above collector currents $I_{C3}$, $I_{C4}$ can always be equal to a constant value $I_{10}$ ($I_{C3} + I_{C4} = I_{10}$), where $I_{10}$ represents the current flowing through the constant current source 10. A voltage drop $E_{R3}$ in one resistor $R_3$ occurring because of the corresponding current $I_{C3}$ and another voltage drop $E_{R4}$ in one resistor $R_4$ occurring because of the corresponding current $I_{C4}$ are issued, respectively, from a pair of output terminals illustrated in FIG. 2 as nodes $N_3$, $N_4$, as first output signals C, D. Further, the above output signals C, D are supplied to a pair of input terminals of the next stage amplifier.

Here, the above first output signals C, D are calculated from the following equations (1) and (2), respectively:

$$C = V_{CC} - E_{R3} = V_{CC} - (I_{C3} + I_{L1C}) r_3 \qquad (1)$$

$$D = V_{CC} - X_{R4} = V_{CC} - (I_{C4} + I_{L1D}) r_4 \qquad (2)$$

where, $I_{L1C}$, $I_{L1D}$ = loading currents flowing into a pair of input terminals of the next stage amplifier, respectively (hereinafter, the above loading currents will be called main loading currents)

$r_3$, $r_4$ = resistance values of the resistors $R_3$, $R_4$, respectively.

At the same time, second output signals E, F are also taken out, respectively, from a pair of output terminals illustrated in FIG. 2 as node $N_3$, $N_4$. Further, the above output signals E, F are supplied to the logical circuit $G_O$, via the selector circuit.

Here, the above second output signals E, F are calculated from the following equations (3) and (4), respectively:

$$E = V_{CC} - E_{R3} = V_{CC} - (I_{C3} + I_{L2E}) r_3 \qquad (3)$$

$$F = V_{CC} - E_{R4} = V_{CC} - (I_{C4} + I_{L2F}) r_4 \qquad (4)$$

where, $I_{L2E}$, $I_{L2F}$ = loading currents flowing into input portions of the logical circuit $G_O$ (hereinafter, the above loading currents will be called branch loading currents).

In such a construction, the first output signals C and D and second output signals E and F are sent from the same nodes $N_3$, $N_4$ to the corresponding pair of input terminals of each next stage amplifier and the selector circuit, respectively. In other words, the above first and second output signals are taken out in parallel formation for the same nodes $N_3$, $N_4$.

To be more specific, the pair of differential transistors $Q_3$, $Q_4$ have to drive an equivalent capacitance C of an input impedance of the next stage amplifiers (and sometimes also the selector circuit) connected to the above nodes $N_3$, $N_4$. In this case, the voltages $V_I$ of the first output signals C, D (and sometimes also the second output signals E, F) are related to the voltages $V_O$ of a first output signals C, D of the next stage amplifier by the following equation, and in accordance with the known transient response:

$$V_O = (1 - e^{-t/CR}) V_I$$

where,
t = time
C = the value of an equivalent capacitance of an input impedance of the next stage amplifier
R = the value of an equivalent resistance of an input impedance of the next stage amplifier.

As is apparent from the above equation, the threshold voltage for the first transistor and the last transition of each pulse signal of the output signals C, D is determined by a time constant (CR) corresponding to the product of C and R. Accordingly, if the value of the above capacitance increases up to twice as much as usual, the rise time and the fall time of the above pulse signal are also doubled and therefore a time lag larger than usual may occur when transferring the pulse signal.

For example, as shown in FIG. 1, in the construction in which the second output signals E, F are taken out from the three amplifiers $G_1$, $G_2$ and $G_4$, respectively, while the above signals E, F are not taken out from the remaining amplifier $G_3$, the transfer time for transferring the pulse signal in the latter amplifier $G_3$ becomes smaller than that in the former amplifiers $G_1$, $G_2$ and $G_4$, and it becomes difficult to obtain a clear oscillating signal with a sharp transition edge of pulse because of said difference in the transfer time between the four amplifiers $G_1$, $G_2$, $G_3$ and $G_4$.

Furthermore, in the case that combinations of various kinds of second output signals from many amplifiers are appropriately executed by the logical circuit $G_O$ so that the final oscillating signal is set to a desired frequency, if only one of the second output signals E, F, corresponding to either one of the nodes $N_3$, $N_4$, is selected, then the selector circuit performs switching operations and the difference between the branch loading currents $I_{L2E}$, $I_{L2F}$ that flow into the selector circuit, respectively, has occurred in the pair of output terminals corresponding to the nodes $N_3$, $N_4$.

Accordingly, the difference between the currents that flow through the resistors $R_3$, $R_4$, respectively, has also occurred and the corresponding voltage drop $E_{R3}$ in one resistor $R_3$ and another voltage drop $E_{R4}$ in another resistor $R_4$ become different from each other. Therefore, as shown in the equations (1) and (2), the voltages of output signals between the corresponding first output signals C, D also become unbalanced because of the changes of the above voltage drops $E_{R3}$, $E_{R4}$. Furthermore, when the input impedances of each pair of input terminals of amplifiers are not sufficiently high, the main loading currents $I_{L1C}$, $I_{L1D}$ are originally relatively large and the changes of the above voltage drops $E_{R3}$, $E_{R4}$ owing to the changes of the above main loading currents $I_{L1C}$, $I_{L1D}$, are likely to increase.

Therefore, the phase lag for each stage of the multi-stage amplifiers becomes somewhat different from each other and also the phase lag between the nodes $N_3$ and $N_4$ of the same amplifier becomes different. Consequently, jitters (typically, time length of the jitter is 2 ns to 4 ns), etc., occur in the trailing edges of the pulses of the first and second output signals owing to the phase lag imbalance, and consequently the setting value of the period of the oscillating signal by frequency dividing operations is incorrect. Thus, the prior art, as shown in FIG. 1 and 2, has a disadvantage in that it is difficult for an oscillating frequency corresponding to the period of a final output signal to be set accurately because of the above jitters, etc.

Figure 3:
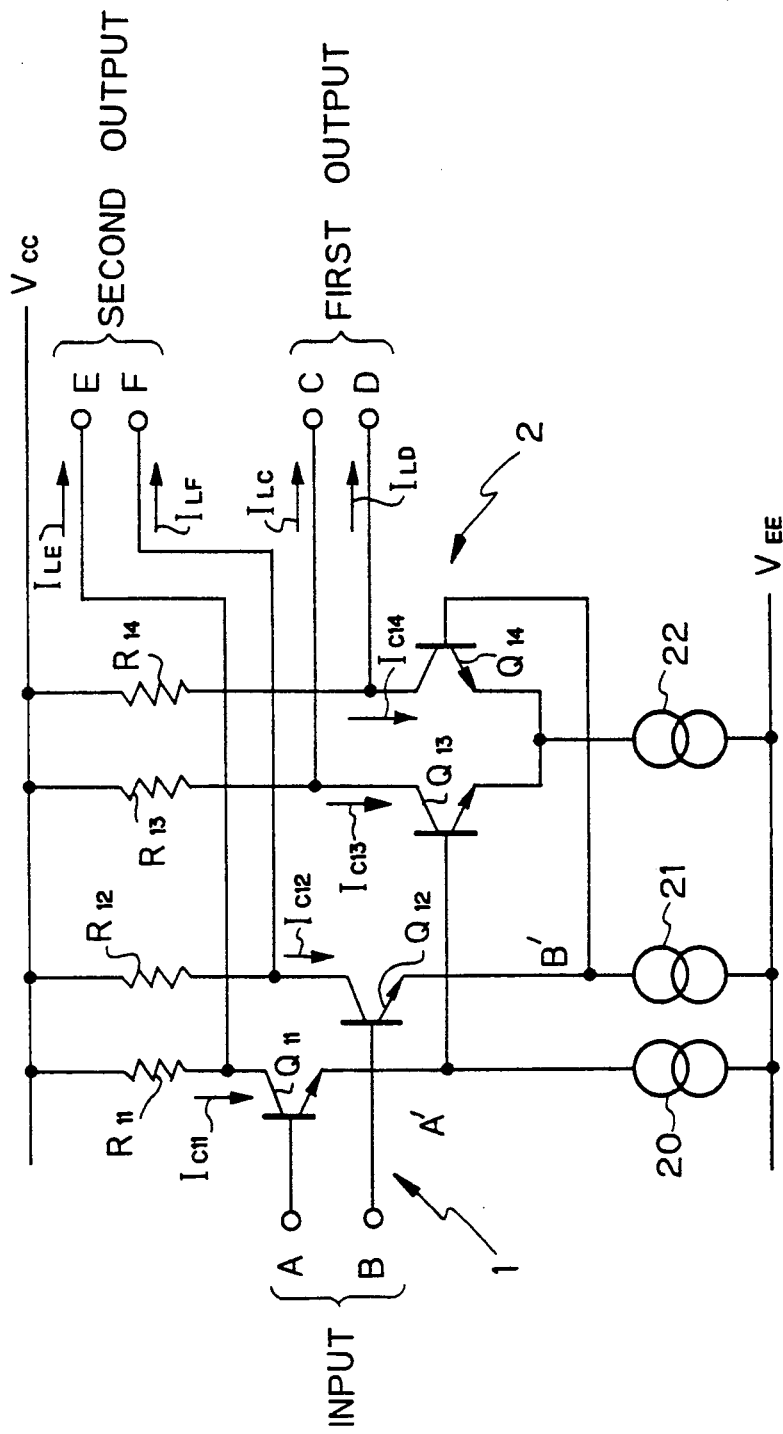
FIG. 3 is a circuit diagram showing the construction of each amplifier constituting the main part of a first preferred embodiment of a ring oscillator according to the present invention.

FIGS. 3 and 4 are views showing a first preferred embodiment of a ring oscillator according to the present invention. To be more specific, FIG. 3 is a circuit diagram showing the construction of each amplifier constituting the main part of the first preferred embodiment and FIG. 4 is a schematic block diagram showing the ring oscillator utilizing the amplifier of FIG. 3. Henceforth, any component that is the same as that previously mentioned will be referred to using the same reference number.

In FIG. 3, an amplifying circuit according to the present invention includes multi-stage differential amplifying units and a pair of emitter follower units 1. In this case, only one differential amplifying unit 2 is illustrated representatively in order to simplify the drawings and the explanation thereof. Further, many amplifiers, such as more than three amplifiers, are usually connected in cascade formation to constitute a ring oscillator. However, in FIG. 4, only three amplifiers $G_1$, $G_2$ and $G_3$ connected in three stages will be illustrated representatively in order to simplify the drawings and the explanation thereof.

First, in FIG. 3, $Q_{11}$ and $Q_{12}$ denote a pair of emitter follower transistors for constituting a pair of emitter follower units 1 in which complementary input signals A, B (also, other first output signals from a pair of output terminals of the last stage amplifier) are supplied to a pair of input terminals. Henceforth, "transistor" always means a conventional bipolar transistor, with the exception of the undermentioned metal-oxide-semiconductor transistor. Further, the above input signals A, B are taken out from the respectively corresponding emitters of the above pair of emitter follower units 1, as in-phase signals A′, B′, respectively. Further, a first resistor $R_{11}$ and a second resistor $R_{12}$ are connected between the respectively corresponding collectors of the above pair of emitter follower transistors $Q_{11}$ and $Q_{12}$ of the emitter follower units 1 and a higher voltage power source line, e.g., a power supply line for a collector voltage $V_{CC}$. The voltages that are related to the respectively corresponding voltage drops $E_{R11}$, $E_{R12}$ in the above first and second resistors $R_{11}$, $R_{12}$ are taken out as the second output signals, i.e., branch output signals. Here, the above first and second resistors $R_{11}$, $R_{12}$ function as a pair of second load elements that generate the respectively corresponding voltages proportional to collector currents $I_{C11}$, $I_{C12}$ flowing through the respective emitter follower transistors $Q_{11}$, $Q_{12}$. Further, 20 and 21 denote constant current sources of the above emitter follower transistors $Q_{11}$, $Q_{12}$, respectively. An emitter voltage $V_{EE}$ is supplied from a lower voltage power source line, e.g., a power supply line for an emitter voltage to the above emitter follower transistors $Q_{11}$, $Q_{12}$, via the respectively corresponding constant current sources 20, 21.

Further, $Q_{13}$ and $Q_{14}$ denote a pair of differential transistors that are driven by the above pair of emitter follower transistors $Q_{11}$, $Q_{12}$, respectively. The above in-phase signals A', B' are supplied to the respectively corresponding bases of a pair of differential transistors $Q_{13}$, $Q_{14}$ constituting the differential amplifying unit 2. The difference in the current values that are corresponding to the potential difference between the above respective in-phase signals A', B', occurs between collector currents $I_{C13}$, $I_{C14}$ flowing through the respective differential transistors $Q_{13}$, $Q_{14}$. Further, a third resistor $R_{13}$ and a fourth resistor $R_{14}$ are connected between the respectively corresponding collectors of the above pair of differential transistors $Q_{13}$, $Q_{14}$ of the differential amplifying unit 2 and a higher voltage power source line, e.g., a power supply line for a collector voltage $V_{CC}$. The voltages that are related to the respectively corresponding voltage drops $E_{R13}$, $E_{R14}$ in the above third and fourth resistors $R_{13}$, $R_{14}$ are taken out as the first output signals, i.e., main output signals. Here, the above third and fourth resistors $R_{13}$, $R_{14}$ function as a pair of first load elements that generate the respectively corresponding voltages proportional to collector currents $I_{C13}$, $I_{C14}$ flowing through the respective differential transistors $Q_{13}$, $Q_{14}$. Further, 22 denotes a constant current source of the above differential transistors $Q_{13}$, $Q_{14}$. An emitter voltage $V_{EE}$ is also supplied from a lower voltage power source line, e.g., a power supply line for an emitter voltage to the above differential transistors $Q_{13}$ and $Q_{14}$, via the common constant current source 22.

Next, in FIG. 4, three amplifiers $G_1$, $G_2$ and $G_3$ are connected in three stages. The output terminals of a third stage amplifier $G_3$ are connected to the input terminals of a first stage amplifier $G_1$ to form a ring feedback. To be more specific, the first output signals (i.e., main output signals) C, D of the first stage amplifier $G_1$ are supplied to the input terminals of the second amplifier $G_2$ as the input signals A, B thereof, respectively, and also the first output signals C, D of the second stage amplifier $G_2$ are supplied to the input terminals of the third amplifier $G_3$ as the input signals A, B thereof, respectively. Further, the first output signals C, D of the third stage amplifier $G_3$ are supplied to the input terminals of the first amplifier $G_1$ as the input signals A, B, respectively thereof, and consequently a loop construction to form a ring oscillator can be obtained.

Further, in FIG. 4, 30 denotes a selector circuit that selects adequate signals among the respectively corresponding second output signals (i.e., branch output signals) E, F from the three stage amplifiers $G_1$, $G_2$ and $G_3$. 40 denotes a logical unit that is composed of a number of logical elements and that performs logical operations for the above selected signals by the selector circuit 30. Henceforth, the above corresponding second output signals E, F from the respective three stage amplifiers $G_1$, $G_2$ and $G_3$ will be defined as $E_1$, $F_1$, $E_2$, $F_2$ and $E_3$, $F_3$, respectively, to be clearly distinguished among these second output signals, especially in undermentioned FIGS. 5 and 6.

To be more specific concerning the operations of the above selector circuit unit 30, all of the second output signals $E_1$, $F_1$, $E_2$, $F_2$ and $E_3$, $F_3$ issued from the respective three stage amplifiers $G_1$, $G_2$, $G_3$ are input to the selector circuit 30 that is composed of six electronic controllable switch elements (illustrated in FIG. 4 by $\bigcirc$), at the first step. Here, the above selector circuit 30 is adapted to switch on and switch off the respective switch elements individually dependent on whether or not the respectively corresponding second output signals are selected by the given external control signals. More concretely, if the unselected second output signals E, F are present, the corresponding switch elements are turned off and the voltage levels of the corresponding connecting points between the resistors $R_{11}$, $R_{12}$ and the collectors of emitter follower transistors $Q_{11}$, $Q_{12}$ are set at zero (0 volt). In other words, the selector circuit 30 is operative to select the necessary second output signals owing to the level transformations by means of switch elements and therefore is often called level transforming circuit. On the contrary, the other selected second output signals E, F pass through the selector circuit 30 and are input to the logical unit 40. After the logical operations are executed in the above logical unit 40 for the other selected second output signals E, F, the oscillating signal OUT (or the inverted signal $\overline{\text{OUT}}$ thereof) having a desired frequency is finally output.

Figure 6:
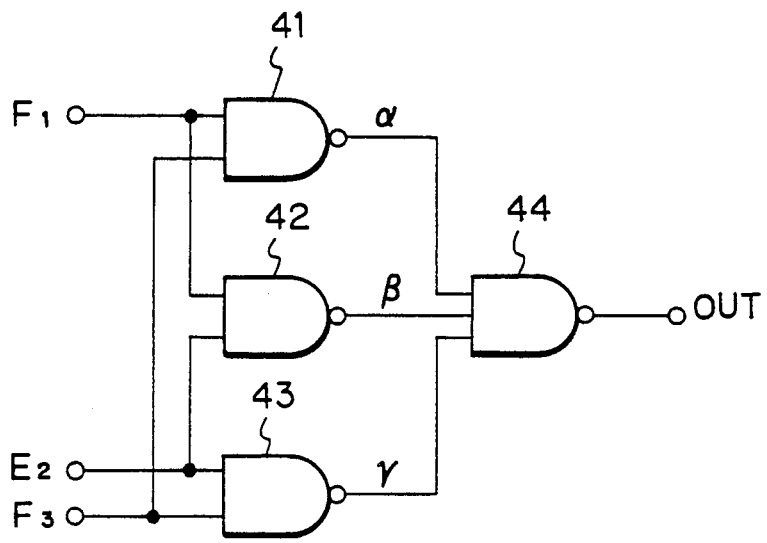
FIG. 6 is a circuit diagram showing the construction of a logical unit of FIG. 4.
Figure 7:
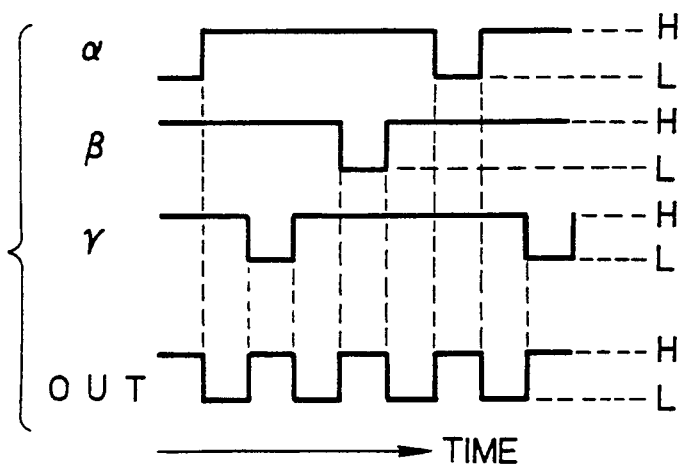
FIG. 7 is an example of a time chart showing the waveform from each internal element of a logical unit of FIG. 6.

FIGS. 5, 6 and 7 are time charts and a circuit diagram explaining the operations of the logical unit. To be more specific, FIG. 5 is an example of a time chart showing second output signals in a ring oscillator of FIG. 4; FIG. 6 is a circuit diagram showing the construction of a logical unit of FIG. 4, and FIG. 7 is an example of a time chart showing the waveform from each logical element of a logical unit of FIG. 6.

In FIG. 5, the levels of each pair of the second output signals $E_1$, $F_1$, $E_2$, $F_2$ and $E_3$, $F_3$, e.g., a pair of the second output signals $E_1$, $F_1$ in the first stage amplifier $G_1$ are in inverting relation to each other. Namely, if the level of one signal $E_1$ of the pair of the second output signals $E_1$, $F_1$ is at a high level ("H") at a certain time, then the level of another signal of the pair of the second output signals $E_1$, $F_1$ is at a low level ("L") at the above time. Further, a predetermined phase lag (time lag) is given to each pair of the second output signals for each stage of the three stage amplifiers $G_1$, $G_2$ and $G_3$, in order of cascade connection of the above three stage amplifiers $G_1$, $G_2$ and $G_3$.

In this case, as shown in FIG. 6, the logical unit 40 including four NAND gates 41, 42, 43 and 44 as plural logical elements is illustrated representatively. Here, it is assumed that only second output signals $F_1$, $E_2$ and $F_3$ of all the second output signals are selected by the selector circuit 30. In FIG. 6, the waveforms of logical output signals α, β and γ and oscillating output signal OUT, corresponding to the respective NAND gates 41, 42, 43 and 44, are illustrated. To be more specific, the logical output signal α is at a low level ("L") when both of the second output signals $F_1$, $F_3$ are at a high level ("H"), and also the logical output signal β is at a low level when both of the second output signals $F_1$, $E_2$ are at a high level, and also the logical output signal γ is at a low level when both of the second output signals $E_2$, $F_3$ are at a high level. Accordingly, if the second output signals $F_1$, $E_2$ and $F_3$ are combined through the logical unit 40, the oscillating output signal OUT, having a frequency three times higher than the second output signals E, F, can be generated.

Further, the voltage level of one signal E of the pair of second (branch) output signals E and F for each stage amplifier is equal to the value that is obtained by subtracting the voltage drop $E_{R11}$ in the first resistor $R_{11}$ from the collector voltage $V_{CC}$ of a higher voltage power source line ($V_{CC}-E_{R11}$). On the other hand, the voltage level of another signal F thereof is equal to the value that is obtained by subtracting the voltage drop $E_{R12}$ in the second resistor $R_{12}$ from the collector voltage $V_{CC}$ ($V_{CC}-E_{R12}$). Furthermore, the voltage level of one signal C of the pair of first (main) output signals C and D for each stage amplifier is equal to the value that is obtained by subtracting the voltage drop $E_{R13}$ in the third resistor $R_{13}$ from the collector voltage $V_{CC}$ ($V_{CC}-E_{R13}$). On the other hand, the voltage level of another signal D thereof is equal to the value that is obtained by subtracting the voltage drop $E_{R14}$ in the fourth resistors $R_{14}$ from the collector voltage $V_{CC}$ ($V_{CC}-E_{14}$).

In this case, the above voltage drops $E_{R11}$, $E_{R12}$, $E_{R13}$ and $E_{R14}$ are calculated from the following equations (5), (6), (7) and (8), respectively:

$$E_{R11}=(I_{C11}+I_{LE})\, r_{11} \quad (5)$$

$$E_{R12}=(I_{C12}+I_{LF})\, r_{12} \quad (6)$$

$$E_{R13}=(I_{C13}+I_{LC})\, r_{13} \quad (7)$$

$$E_{R14}=(I_{C14}+I_{LD})\, r_{14} \quad (8)$$

where, $I_{LE}$, $I_{LF}$ = loading currents corresponding to the second output signals E, F, respectively $I_{LC}$, $I_{LD}$ = loading currents corresponding to the first output signals C, D, respectively $r_{11}$, $r_{12}$ = resistance values of the first and second resistors $R_{11}$, $R_{12}$, respectively $r_{13}$, $r_{14}$ = resistance values of the third and fourth resistors $R_{13}$, $R_{14}$, respectively.

As apparent from these equations (5), (6), (7) and (8), in the first preferred embodiment according to the present invention, even though the loading currents $I_{LE}$, $I_{LF}$ corresponding to the branch output signals E, F fluctuate because of the switching operations of the selector circuit 30, these changes have no influence on the voltage drop $E_{R13}$, $E_{R14}$ related to the main output signals C, D, respectively. Therefore, the changes of the voltage levels of the main output signals C, D, respectively, can be avoided. Accordingly, the phase lag (time lag) between one side and another side of each pair of output terminals remains balanced, and the time length of jitters occurring in the trailing edge of the pulse owing to the above phase lag imbalance can be reduced from the value of 2 ns to 4 ns to the value of 1 ns to 2 ns.

To be more specific about a bipolar transistor, generally, a base and an emitter of the transistor are closely related to each other. On the contrary, a collector and an emitter of the transistor are substantially separated from each other by a relatively high impedance. In this case, the main signal lines are constituted from the bases of the emitter follower transistors $Q_{11}$, $Q_{12}$ to the emitters thereof that are connected to the respectively corresponding bases of the differential transistors $Q_{13}$, $Q_{14}$. It should be noted that the branch output signals are taken out from the collectors of the emitter follower transistors $Q_{11}$, $Q_{12}$ that are separated from the main signal lines. Consequently, a phase lag for each stage of multi-stage amplifiers can be accurately maintained at an intended value, and the oscillating frequency (period) can be stably generated.

In the case that the amplifying circuit of each stage amplifier comprises more than two differential amplifying units connected in a multi-stage connection, the branch output signals can also be taken out from the collectors of the differential transistors in any unit other than the final stag differential amplifying unit 2.

Figure 8:
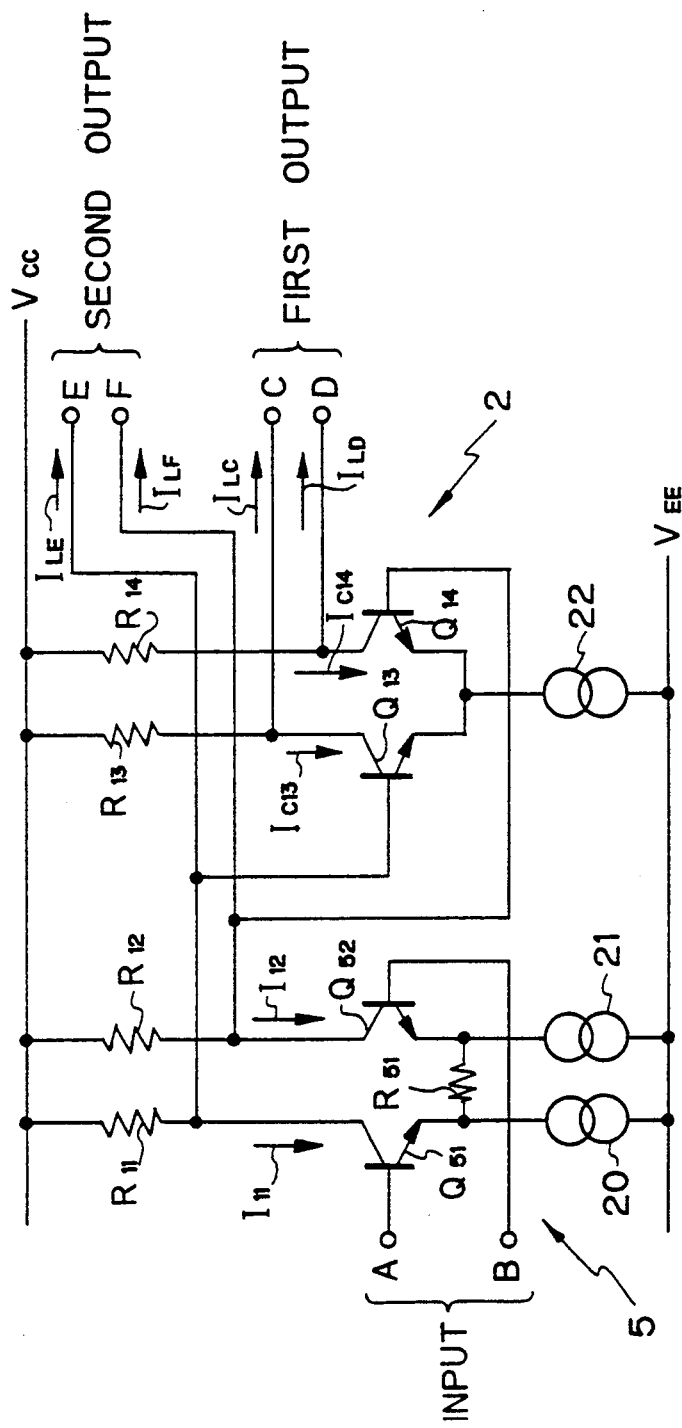
FIG. 8 is a circuit diagram showing the construction of each amplifier constituting the main part of a second preferred embodiment of a ring oscillator according to the present invention.

FIG. 8 is a circuit diagram showing the construction of each amplifier constituting the main part of a second preferred embodiment of a ring oscillator according to the present invention.

In FIG. 8, a differential amplifying unit 5 is utilized, instead of a pair of emitter follower units 1 of the first preferred embodiment as shown in FIG. 3. Other components in the circuit construction of FIG. 8 are substantially the same as those of FIG. 3. Further, the above pair of differential amplifying unit 5 includes a pair of differential transistors $Q_{51}$, $Q_{52}$, in which complementary input signals A, B (also, other first output signals from a pair of output terminals of the last stage amplifier) are supplied to a pair of input terminals. Further, the above input signals A, B are taken out from the respectively corresponding collectors of the above pair of differential transistors $Q_{51}$, $Q_{52}$, as in-phase signals, respectively. Further, a balancing resistor $R_{51}$ is connected between the emitters of the above pair of differential transistors $Q_{51}$ and $Q_{52}$ and a lower voltage power source line, e.g., a power supply line for an emitter voltage $V_{EE}$, to ensure that the input signals A, B are transmitted at a relatively high speed. Similar to the first preferred embodiment, the voltages that are related to the respectively corresponding voltage drops $E_{R11}$, $E_{R12}$ in the first and second resistors $R_{11}$, $R_{12}$ are taken out as the second output signals, i.e., branch output signals. Also, the above in-phase signals are supplied to the respectively corresponding bases of a pair of differential transistors $Q_{13}$, $Q_{14}$ constituting the differential amplifying unit 2.

Namely, in this second preferred embodiment, an amplifying circuit includes two differential amplifying units 5, 2 connected in two stages and arranged between the output terminals and the input terminals and each having a pair of differential transistors.

In such a construction, the branch output signals E, F are also taken out from the portions that are different from the portions of the main output signals A, B. Therefore, even though the loading currents $I_{LE}$, $I_{LF}$ corresponding to the branch output signals E, F fluctuate, these changes have no influence on the voltage drop $E_{R13}$, $E_{R14}$ related to the main output signals C, D, respectively. Consequently, the changes of the voltage levels of the main output signals C, D respectively, can be avoided, similar to the first preferred embodiment as previously described.

Figure 9:
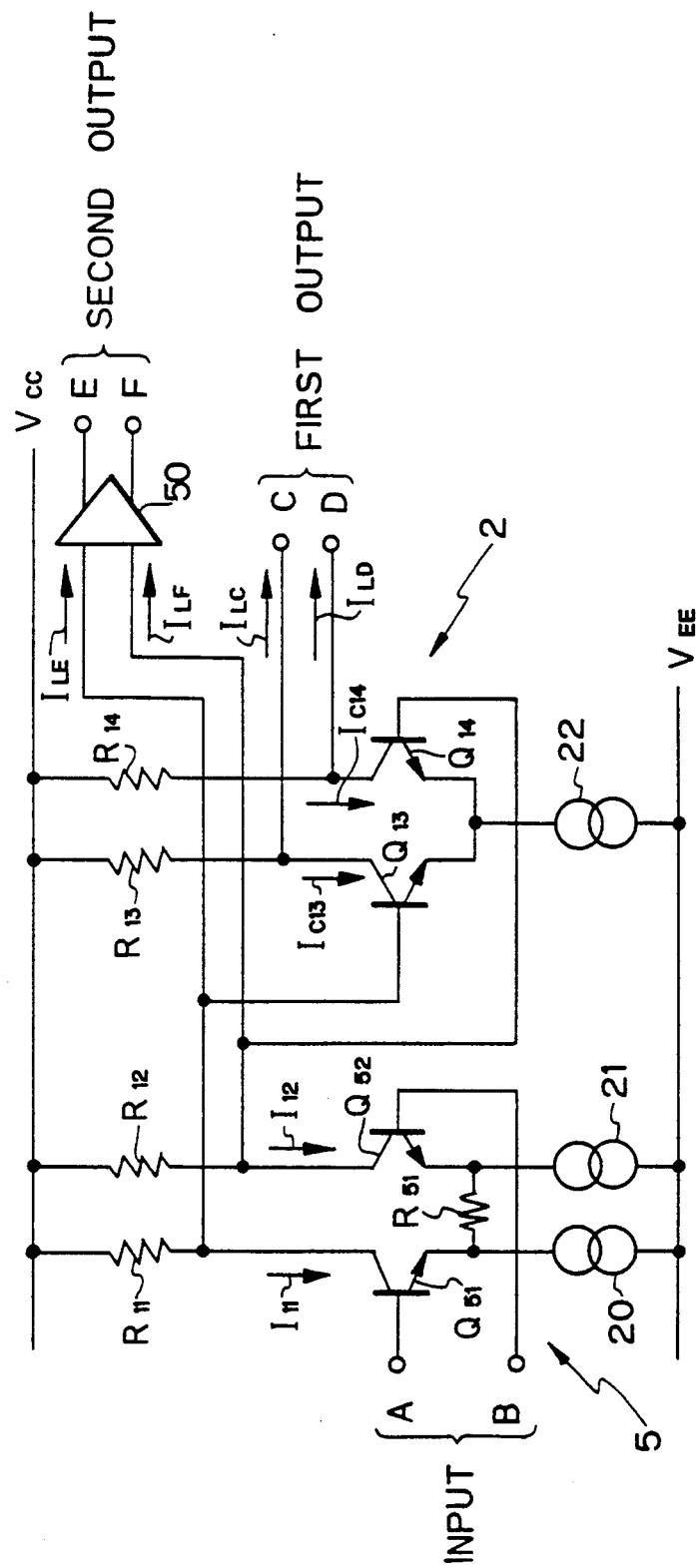
FIG. 9 is a circuit diagram showing a modification of FIG. 8.

FIG. 9 is a circuit diagram showing a modification of FIG. 8. In FIG. 9, a buffer unit 50, e.g., operational amplifying circuit is further provided between the respective collectors of one pair of differential transistors $Q_{51}$, $Q_{52}$ and the selector circuit 30 (see FIG. 4), in addition to the components of the second preferred embodiment as shown in FIG. 8, so that the respectively corresponding second output signals E, F can be issued via the above buffer unit 50. In such a construction, it can be ensured that the selector circuit 30 is completely separated from the respectively corresponding bases of another pair of differential transistors $Q_{13}$, $Q_{14}$ and that the first output signals C, D are prevented from being influenced by the switching operations of the above selector circuit 30.

Figure 10:
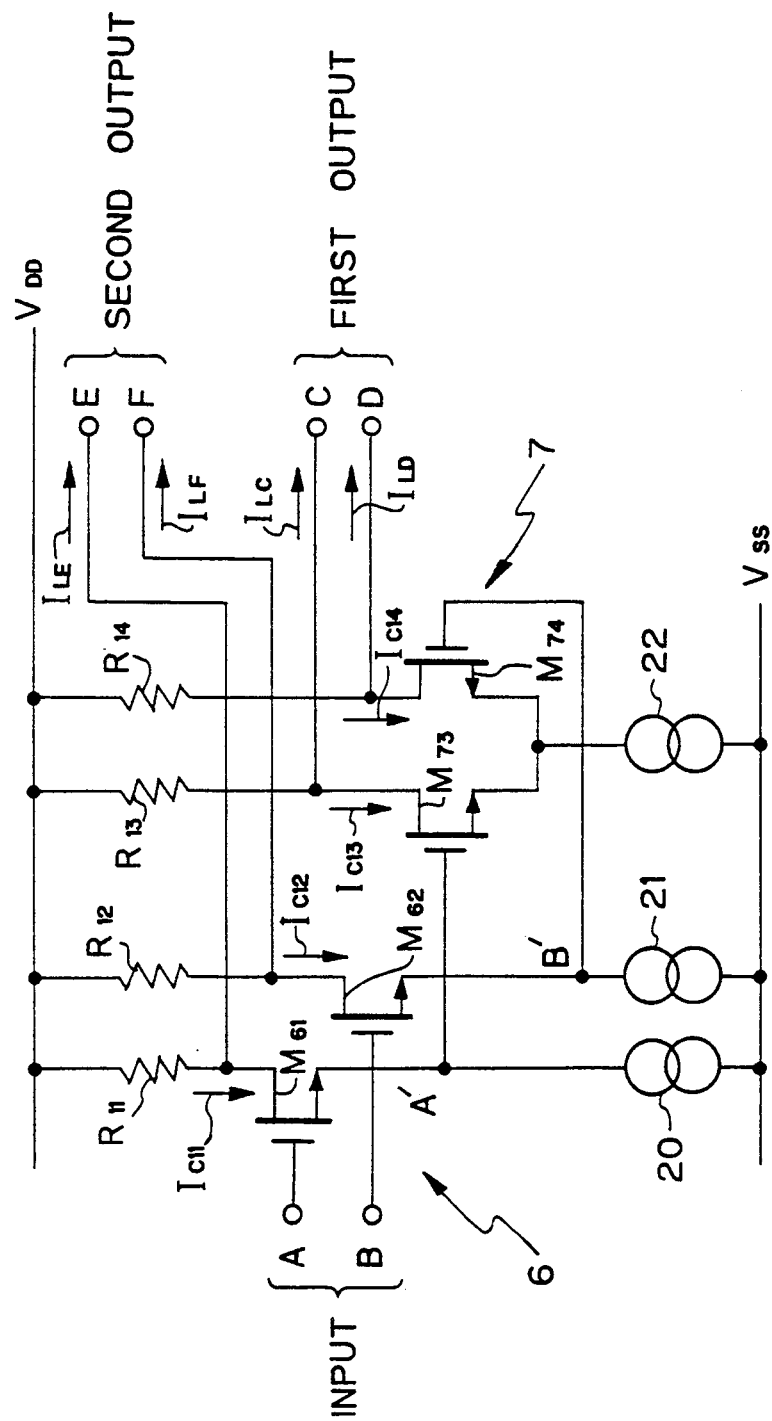
FIG. 10 is a circuit diagram showing the construction of each amplifier constituting the main part of a third preferred embodiment of a ring oscillator according to the present invention.

FIG. 10 is a circuit diagram showing the construction of each amplifier constituting the main part of a third preferred embodiment of a ring oscillator according to the present invention.

In FIG. 10, a pair of differential metal-oxide-semiconductor transistors and a pair of source follower metal-oxide-semiconductor transistors (typically, N-channel type metal-oxide-semiconductor transistors) are utilized for the amplifying circuit, instead of bipolar transistors as previously described. To be more concrete, an amplifying circuit of each stage amplifier comprises a differential amplifying means 7 having a pair of differential metal-oxide-semiconductor transistors $M_{73}$, $M_{74}$, whose output portions are connected to the output terminals, respectively. Further, the above amplifying circuit comprises a pair of source follower units 6 having source follower metal-oxide-semiconductor transistors $M_{61}$, $M_{62}$, respectively, whose respective output portions are connected to the input portions of the above differential amplifying means 7 to drive the above pair of differential metal-oxide-semiconductor transistors $M_{73}$, $M_{74}$, respectively. Other components in the circuit construction of FIG. 10 are substantially the same as those of FIG. 3.

In this case, a source, a gate and a drain of a metal-oxide-semiconductor transistor are corresponding to an emitter, a base and a collector of a bipolar transistor, respectively. Further, power source lines for a drain voltage $V_{DD}$ and a source voltage $V_{SS}$ are corresponding to power source lines for a collector voltage $V_{CC}$ and an emitter voltage $V_{EE}$, respectively.

In this third preferred embodiment utilizing metal-oxide-semiconductor transistors, the speed of the circuit operations is lower than the speed of the circuit operations composed of bipolar transistors as previously described. However, the above third preferred embodiment has an advantage in that the whole power consumption can be reduced lower than other preferred embodiments utilizing bipolar transistors because of inherent characteristics in the metal-oxide-semiconductor transistors.

Figure 11:
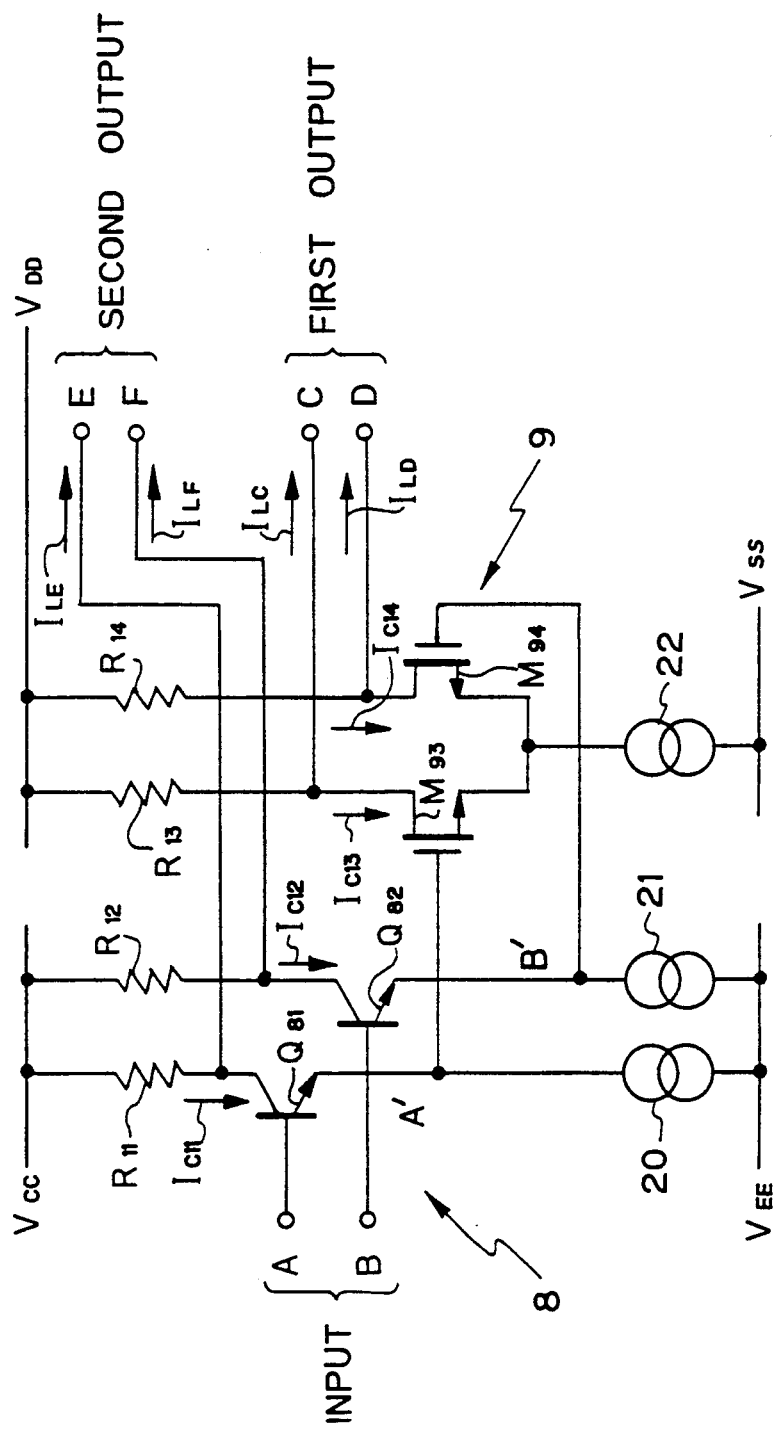
FIG. 11 is a circuit diagram showing the construction of each amplifier constituting the main part of a fourth preferred embodiment of a ring oscillator according to the present invention, and, FIG. 12 is an example of a time chart explaining the difference in a pulse signal between the present invention and a prior art.

FIG. 11 is a circuit diagram showing the construction of each amplifier constituting the main part of a fourth preferred embodiment of a ring oscillator according to the present invention.

In FIG. 11, a differential amplifying means 9 having a pair of differential metal-oxide-semiconductor transistors $M_{93}$, $M_{94}$ and a pair of emitter follower units 8 having emitter follower transistors $Q_{81}$, $Q_{82}$, respectively, are provided as the main components of the amplifying circuit. In this case, one advantage of the bipolar transistors that they provide higher speed circuit operations and another advantage of the metal-oxide-semiconductor transistors that they use less power are combined together.

To be more concrete, an amplifying circuit of each stage amplifier comprises a differential amplifying means 9 having a pair of differential metal-oxide-semiconductor transistors $M_{93}$, $M_{94}$, whose output portions are connected to the output terminals, respectively. Further, the above amplifying circuit comprises a pair of emitter follower units 8 having emitter follower transistors $Q_{81}$, $Q_{82}$, respectively, whose respective output portions are connected to the input portions of the above differential amplifying means 8 to drive the above differential metal-oxide-semiconductor transistors $M_{93}$, $M_{94}$, respectively. Other components in the circuit construction of FIG. 11 are substantially the same as those of FIG. 3.

As explained above in detail, according to the present invention, the branch output signals are taken out from the output portions that are separated from the main output terminals. Therefore, even though the currents in the branch output signals fluctuate because of the switching operations of the selector circuit, such fluctuations have no influence on the voltage drops in the pair of main load elements. Consequently, the voltage changes in the main output signals can be avoided. Finally, a phase lag for each stage of multi-stage amplifiers can be accurately maintained at an intended value, and the oscillating frequency (period) can be stably generated.

FIG. 12 is an example of a time chart explaining the difference in a pulse signal between the present invention and a prior art.

In all the preferred embodiment previously described, the second output signals E, F are taken out from a portion different from the output terminals of the first output signals C, D. Therefore, according to the present invention, the pair of differential transistors in the output terminals have only to drive the equivalent capacitance C having the same capacitance value for all the amplifiers, e.g., four amplifiers $G_1$, $G_2$, $G_3$ and $G_4$ (see FIG. 1), in any case. Accordingly, as shown in FIG. 12(a), the rise time and fall time of the pulse signal always remain constant for all the amplifiers.

Figures 12A, 12B:
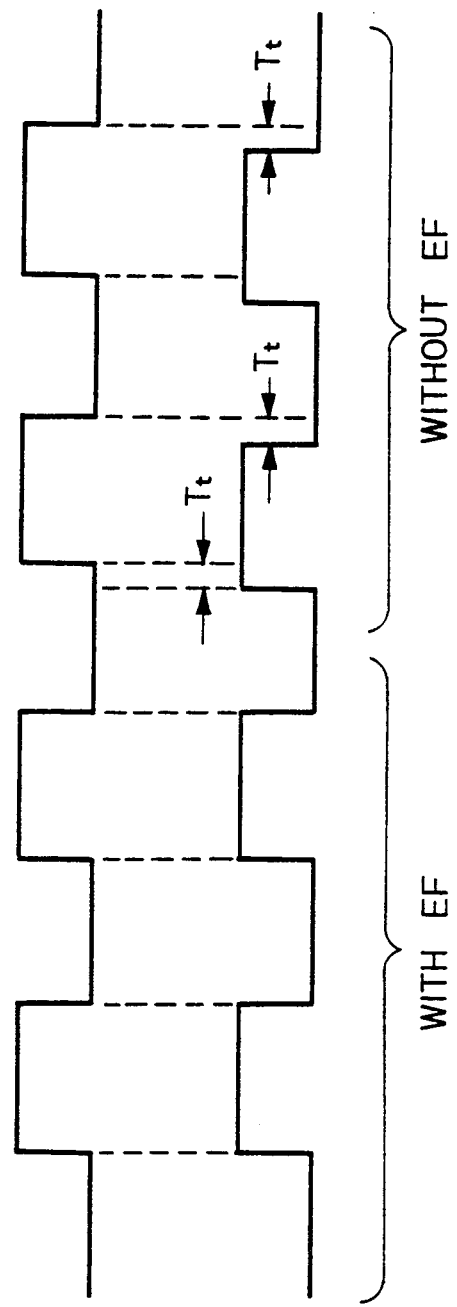

More specifically, in the prior art illustrated in FIGS. 1 and 2, the amplifiers $G_1$, $G_2$ and $G_4$, from which the second output signals E, F are taken out, have longer transfer times than the remaining amplifier $G_3$, from which the second output signals E, F are not taken out, by a value of $T_t$, as shown in FIG. 12(b). On the contrary, in the present invention, as shown in FIG. 12(a), the transfer time becomes constant for each amplifier regardless of the presence of the second output signals E, F.

Further, since the second output signals E, F are taken out from any portions other than the final stage amplifying unit within each amplifier, the above second output signals E, F can be driven independently of the first output signals C, D. Consequently, the load of the above amplifying unit that occurred when taking out the above second output signals E, F is not serious, and a sufficiently clear oscillating signal can be finally obtained.

We claim:

1. A ring oscillator comprising a plurality of amplifiers connected to each other so that a multi-stage connection and a ring feedback can be executed, and each including:
   a pair of output terminals from which first output signals are issued, respectively;
   a pair of input terminals to which another pair of output terminals of a last stage amplifier are connected, respectively, and,
   an amplifying circuit arranged between said output terminals and said input terminals, an oscillating signal with a desired frequency being generated by taking out respectively corresponding second output signals from said amplifiers and combining said second output signals, wherein said ring oscillator is constructed such that said second output signals are taken out from any middle output terminals in said amplifying circuit, other than said output terminals and said input terminals.

2. A ring oscillator as set forth in claim 1, wherein said amplifying circuit includes:

differential amplifying units constituted in at least one stage and each having a pair of differential transistors, in which the output portions of a final stage differential amplifying unit are connected to said output terminals, respectively, and, a pair of emitter follower units having emitter follower transistors, respectively, whose respective input portions are connected to said input terminals and whose respective output portions are connected to the input portions of a first stage differential amplifying unit to drive said differential transistors, respectively, wherein said ring oscillator is constructed such that said second output signals are taken out from any predetermined output portions among said output portions of said emitter follower units and all stage differential amplifying units other than said final stage differential amplifying unit.

3. A ring oscillator as set forth in claim 1, wherein said amplifying circuit includes:

a differential amplifying unit constituted in one stage and having a pair of differential transistors whose output portions are connected to said output terminals, respectively;

a pair of emitter follower units having emitter follower transistors, respectively, whose respective output portions are connected to the input portions of said differential amplifying unit to drive said differential transistors, respectively;

a pair of first load elements that generate respectively corresponding voltages proportional to the currents flowing through said respective differential transistors, and, a pair of second load elements that generate respectively corresponding voltages proportional to the currents flowing through said respective emitter follower transistors, and wherein said ring oscillator is constructed such that the respectively corresponding voltages generated by said first load elements, or voltages that are related to said respectively corresponding voltages generated by said first load elements, are taken out as said first output signals, respectively, and also the respectively corresponding voltages generated by said second load elements, or voltages that are related to said respectively corresponding voltages generated by said second load elements, are taken out as said second output signals, respectively.

4. A ring oscillator as set forth in claim 3, wherein said first load elements are resistors connected between the respectively corresponding collectors of said differential transistors and a common power source line, and also said second load elements are resistors connected between the respectively corresponding collectors of said emitter follower transistors and said common power source line.

5. A ring oscillator as set forth in claim 1, wherein said amplifying circuit includes:

two differential amplifying units connected in two stages and arranged between said output terminals and said input terminals and each having a pair of differential transistors;

a pair of first load elements that generate respectively corresponding voltages proportional to the currents flowing through the respective differential transistors of the second stage amplifying unit, and, a pair of second load elements that generate respectively corresponding voltages proportional to the currents flowing through said respective differential transistors of the first stage amplifying unit, and wherein said ring oscillator is constructed such that the respectively corresponding voltages generated by said first load elements are taken out as said first output signals, respectively, and also the respectively corresponding voltages generated by said second load elements are taken out as said second output signals, respectively.

6. A ring oscillator as set forth in claim 5, wherein said first load elements are resistors connected between the respectively corresponding collectors of said differential transistors of said second stage amplifying unit and a common power source line, and also said second load elements are resistors connected between the respectively corresponding collectors of said differential transistors of said first stage amplifying unit and said common power source line.

7. A ring oscillator as set forth in claim 5, wherein it further comprises buffer units for the respective stage amplifiers, the respectively corresponding second output signals being issued via said buffer units.

8. A ring oscillator as set forth in claim 1 comprising more than three amplifier stages, wherein said ring oscillator further comprises:

a selector circuit that selects adequate signals among the respectively corresponding second output signals from said amplifier stages, and, a logical unit that performs logical operations for said selected signals by said selector circuit to finally provide said oscillating signals with a desired frequency.

9. A ring oscillator as set forth in claim 1, wherein said amplifying circuit includes:

a differential amplifying means constituted in one stage and having a pair of differential metal-oxide-semiconductor transistors whose output portions are connected to said output terminals respectively;

a pair of source follower units having source follower metal-oxide-semiconductor transistors, respectively, whose respective output portions are connected to the input portions of said differential amplifying means to drive said differential metal-oxide-semiconductor transistors, respectively;

a pair of first load elements that generate respectively corresponding voltages proportional to the currents flowing through said respective differential metal-oxide-semiconductor transistors, and, a pair of second load elements that generate respectively corresponding voltages proportional to the currents flowing through said respective source follower metal-oxide-semiconductor transistors, and wherein said ring oscillator is constructed such that the respectively corresponding voltages generated by said first load elements, or voltages that are related to said respectively corresponding voltages generated by said first load elements are taken out as said first output signals, respectively, and also the respectively corresponding voltages generated by said second load elements, or voltages that are related to said respectively corresponding voltages generated by said second load elements, are taken out as said second output signals, respectively.

10. A ring oscillator as set forth in claim 9, wherein said first load elements are resistors connected between the respectively corresponding drains of said differential metal-oxide-semiconductor transistors and a common power source line, and also said second load elements are resistors connected between the respectively corresponding drains of said source follower metal-oxide-semiconductor transistors and said common power source line.

11. A ring oscillator as set forth in claim 1, wherein said amplifying circuit includes:
- a differential amplifying means constituted in one stage and having a pair of differential metal-oxide-semiconductor transistors, whose output portions are connected to said output terminals respectively;
- a pair of emitter follower units having emitter follower transistors, respectively, whose respective output portions are connected to the input portions of said differential amplifying means to drive said differential metal-oxide-semiconductor transistors, respectively;
- a pair of first load elements that generate respectively corresponding voltages proportional to the currents flowing through said respective differential metal-oxide-semiconductor transistors, and,
- a pair of second load elements that generate respectively corresponding voltage proportional to the currents flowing through said respective emitter follower transistors, and wherein said ring oscillator is constructed such that the respectively corresponding voltages generated by said first load elements, or voltages that are related to said respectively corresponding voltages generated by said first load elements, are taken out as said first output signals respectively and also the respectively corresponding voltages generated by said second load elements, or voltages that are related to said respectively corresponding voltages generated by said second load elements, are taken out as said second output signals, respectively.

12. A ring oscillator as set forth in claim 11, wherein said first load elements are resistors connected between the respectively corresponding drains of said differential metal-oxide-semiconductor transistors and a common power source line, and also said second load elements are resistors connected between the respectively corresponding collectors of said emitter follower transistors and another common power source line.

* * * * *

UNITED STATES PATENT AND TRADEMARK OFFICE
CERTIFICATE OF CORRECTION

PATENT NO. : 5,262,735
DATED : November 16, 1993
INVENTOR(S) : Yasuhiro HASHIMOTO et al.

It is certified that error appears in the above-indentified patent and that said Letters Patent is hereby corrected as shown below:

* Col. 7, line 9, delete "a".

Col. 12, line 3, change "stag" to --stage--.

Col. 18, line 2, change "voltage" to --voltages--.

Signed and Sealed this

Eleventh Day of October, 1994

Attest:

BRUCE LEHMAN

Attesting Officer      Commissioner of Patents and Trademarks